(12) United States Patent
Nishizaki et al.

(10) Patent No.: US 9,076,678 B2
(45) Date of Patent: Jul. 7, 2015

(54) SEMICONDUCTOR DEVICE

(75) Inventors: Mamoru Nishizaki, Tokyo (JP); Ken Ota, Tokyo (JP)

(73) Assignee: PS4 LUXCO S.A.R.L., Luxembourg (LU)

( * ) Notice: Subject to any disclaimer, the term of this patent is extended or adjusted under 35 U.S.C. 154(b) by 0 days.

(21) Appl. No.: 13/545,698

(22) Filed: Jul. 10, 2012

(65) Prior Publication Data

US 2013/0015558 A1    Jan. 17, 2013

(30) Foreign Application Priority Data

Jul. 14, 2011    (JP) .................................. 2011-155859

(51) Int. Cl.
| | |
|---|---|
| H01L 29/49 | (2006.01) |
| H01L 27/105 | (2006.01) |
| H01L 23/522 | (2006.01) |
| H01L 27/02 | (2006.01) |
| H01L 27/108 | (2006.01) |
| H01L 49/02 | (2006.01) |

(52) U.S. Cl.
CPC ........ *H01L 27/1052* (2013.01); *H01L 23/5223* (2013.01); *H01L 27/0207* (2013.01); *H01L 27/10817* (2013.01); *H01L 27/10852* (2013.01); *H01L 27/10894* (2013.01); *H01L 27/10897* (2013.01); *H01L 28/91* (2013.01); *H01L 2924/0002* (2013.01)

(58) Field of Classification Search
USPC ......... 257/532, 534, 296, 298, 300, 301, 302, 257/307, 309
See application file for complete search history.

(56) References Cited

U.S. PATENT DOCUMENTS

| | | | | |
|---|---|---|---|---|
| 6,790,725 | B2 * | 9/2004 | Coursey ........................ | 438/253 |
| 7,719,045 | B2 * | 5/2010 | Cho et al. ..................... | 257/309 |
| 7,952,130 | B2 * | 5/2011 | Arai .............................. | 257/309 |
| 8,242,551 | B2 * | 8/2012 | Ching et al. .................. | 257/309 |
| 2004/0099898 | A1 * | 5/2004 | Grivna et al. ................. | 257/309 |
| 2006/0113580 | A1 * | 6/2006 | Cho et al. ..................... | 257/306 |
| 2010/0059806 | A1 * | 3/2010 | Mizushima ................... | 257/301 |
| 2011/0266603 | A1 * | 11/2011 | Nakamura et al. ............ | 257/306 |
| 2012/0161281 | A1 * | 6/2012 | Hasunuma .................... | 257/532 |
| 2013/0052784 | A1 * | 2/2013 | Sugioka et al. ............... | 438/381 |

FOREIGN PATENT DOCUMENTS

WO    98/28789 A1    7/1998

* cited by examiner

*Primary Examiner* — Michael Shingleton

(57) ABSTRACT

A semiconductor device has at least a first capacitor and a second capacitor. First electrodes of the first and second capacitors are connected in common, a first voltage (½ VPERI) is applied to the first electrodes, a second voltage (for example, VPERI) that is different from the first voltage is applied to either one of the second electrodes, and the first voltage is applied to the other second electrode. A capacitor which constitutes a dummy capacitance is provided by applying one of the second electrodes of the first and second capacitors with the same voltage as the voltage applied to their first electrodes, whereby making it possible to increase the area of the compensation capacitance in the semiconductor device without changing a specified capacitance value.

10 Claims, 12 Drawing Sheets

SEMICONDUCTOR DEVICE

This application is based upon and claims the benefit of priority from Japanese patent application No. 2011-155859, filed on Jul. 14, 2011, the disclosure of which is incorporated herein in its entirety by reference.

BACKGROUND OF THE INVENTION

1. Field of the Invention

This invention relates to a semiconductor device.

2. Description of the Related Art

Recently, semiconductor storage devices have become widely used which are provided with memory cells having 3D stacked capacitors in which capacitance electrodes are formed using a vertical plane. For example, WO98/028789 discloses a semiconductor storage device which is provided with a plurality of capacitors each composed of a lower electrode, a capacitor dielectric film, and an upper electrode, and proposes an elaborated manufacturing method of such a semiconductor storage device in terms of a relationship between a memory cell region and a so-called peripheral region thereof.

SUMMARY

The capacitor described in the aforementioned WO98/028789 is a memory cell capacitor. When it is assumed that a capacitor which is produced in the same process as the memory cell capacitor is used as compensation capacitance, an area of the compensation capacitance region differs depending on its capacitance value. If the area of the compensation capacitance region is too small, a problem will arise that a capacitor might be peeled off when it is etched after formation thereof due to its too small contact area with a base.

This problem becomes particularly acute when compensation capacitance is provided in the peripheral region, since there is a difference in height between the peripheral region and the other region. If the area is increased in order to avoid this problem without careful consideration, the capacitance value will be increased, which makes it impossible to set the capacitor to a specified capacitance value.

In one embodiment, there is provided a semiconductor device comprising a first capacitor and a second capacitor each including first and second electrodes, the first electrode of the first capacitor and the first electrode of the second capacitor being connected in common and being supplied with a first voltage, the second electrode of the first capacitor being supplied with a second voltage that is different from the first voltage, and the second electrode of the second capacitor being supplied with the first voltage.

A capacitor which serves as a dummy capacitance is provided by applying at least one of the second electrodes of the first and second capacitors with the same voltage as the voltage applied to their first electrodes, whereby making it possible to increase the area of the compensation capacitance in the semiconductor device without changing a specified capacitance value.

In another embodiment, there is provided a semiconductor device which comprises: a plurality of lower electrodes including a plurality of first lower electrodes supplied with a first voltage and a plurality of second lower electrodes supplied with a second voltage which is different from the first voltage; a plurality of upper electrodes commonly supplied with the first voltage, the upper electrodes including a plurality of first upper electrodes each corresponding to one of the first lower electrodes and a plurality of second upper electrodes each corresponding to one of the second lower electrodes; and a plurality of dielectric films including a plurality of first dielectric films sandwiched between the first lower electrodes and the first upper electrodes, respectively, and a plurality of second dielectric films sandwiched between the second lower electrodes and the second upper electrodes, respectively; wherein the first lower electrodes, the first upper electrodes and the first dielectric films define a first capacitor, and the second lower electrodes, the second upper electrodes and the second dielectric films defining a second capacitor.

In one embodiment, a semiconductor device comprises: a memory cell array region including a plurality of memory cells each of which includes a memory cell capacitor; and a peripheral region including first and second compensation capacitors, each of the first and second compensation capacitors being the same in structure as the memory cell capacitor; wherein, the first compensation capacitor includes first and second electrodes, the second compensation capacitor including third and fourth electrodes, the first electrode of the first compensation capacitor and the third and fourth electrodes of the second compensation capacitor are commonly supplied with a first voltage, and the second electrode of the first compensation capacitor being supplied with a second voltage which is different from the first voltage.

DETAILED DESCRIPTION OF EXEMPLARY EMBODIMENTS

Exemplary embodiments of the invention will be described with reference to the drawings.

First Exemplary Embodiment

Figure 1:
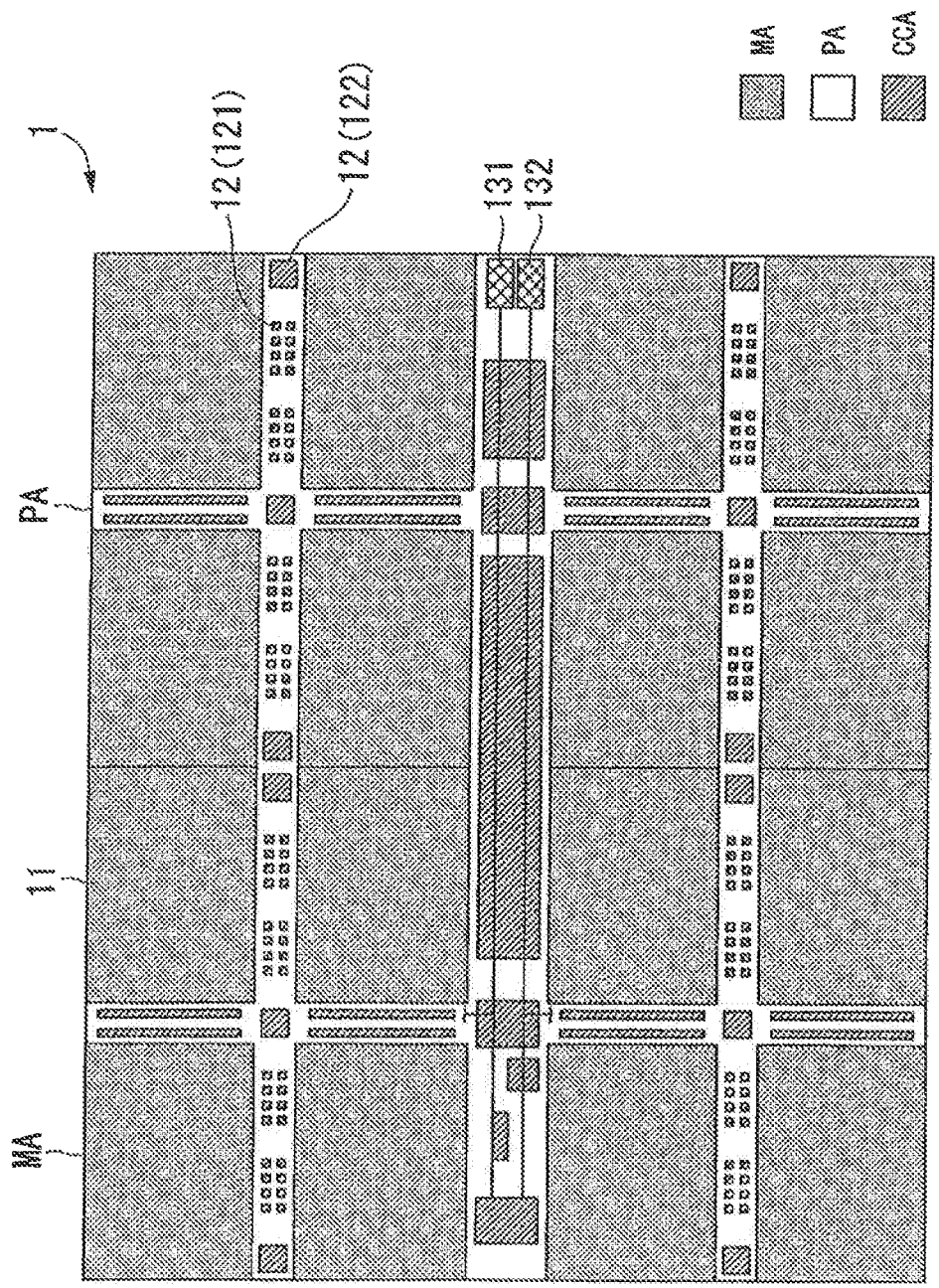
FIG. 1 is a schematic lay-out diagram of a semiconductor device according to a first exemplary embodiment of this invention.

FIG. 1 is a schematic lay-out diagram of a semiconductor device according to a first exemplary embodiment of the invention. As shown in FIG. 1, the semiconductor device 1 according to the first exemplary embodiment is composed of a memory array region MA and a peripheral region PA. The memory array region MA is provided with a plurality of banks 11. The peripheral region PA is provided with a plurality of compensation capacitance portions 12 (first and second compensation capacitance portions 121, 122) arranged in compensation capacitance regions CCA, first and second internal voltage generation circuits 131, 132, and other peripheral circuits not shown. The compensation capacitance portions 12 have different areas according to their specified capacitance values. This means that a compensation capacitance portion having a greater area has a greater capacitance value, whereas a compensation capacitance portion having a smaller area has a smaller capacitance value. The first and second internal voltage generation circuits 131, 132 are connected to the compensation capacitance portions 12, the banks 11, and other peripheral circuits.

Figure 2A:
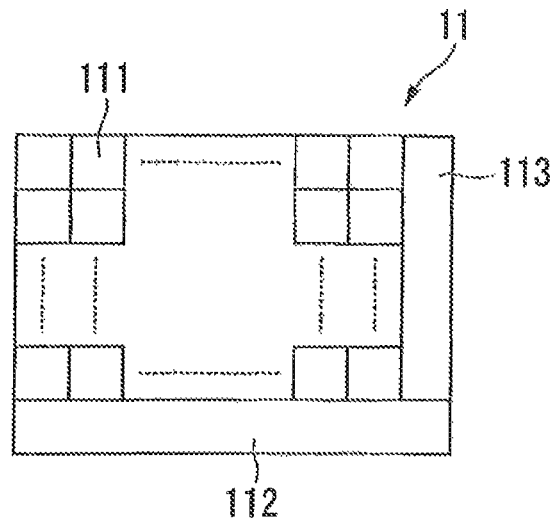
FIGS. 2A and 2B are diagrams for explaining arrangement of banks.
Figure 2B:
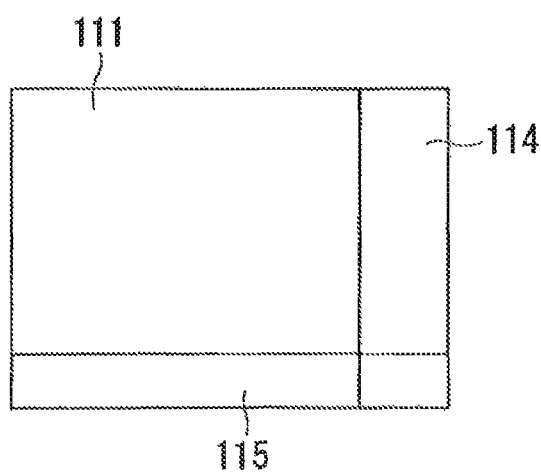

FIG. 2A is a diagram showing a structure of each bank 11. As shown in FIG. 2A, each bank 11 includes a plurality of memory cell portions 111, an X decoder 112, and a Y decoder 113. As shown in FIG. 2B, each of the memory cell portions 111 is provided with a sense amplifier 114 and a sub-word driver 115.

Figure 3:
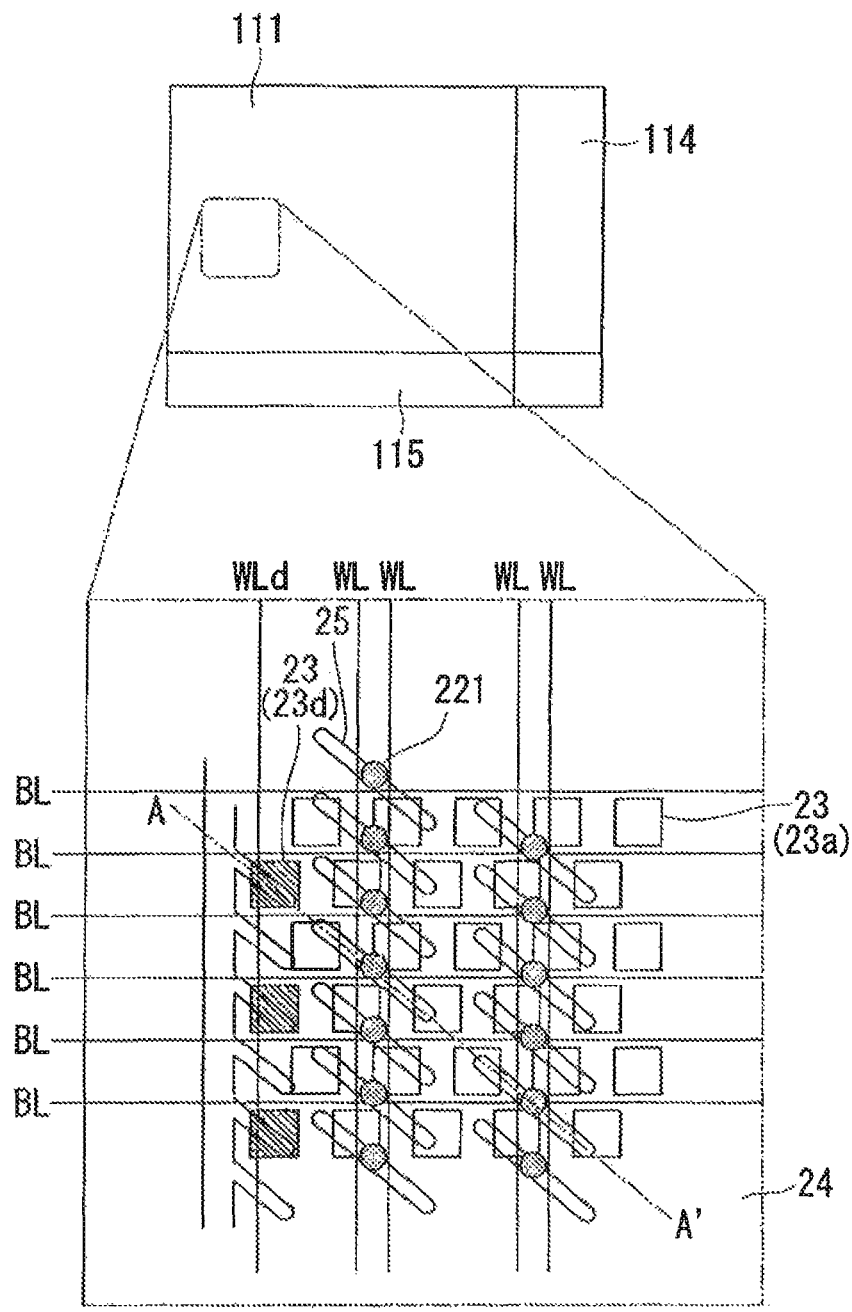
FIG. 3 is a diagram showing a memory cell portion shown in FIG. 2B and an enlarged view showing a detailed configuration of a part thereof.
Figure 4:
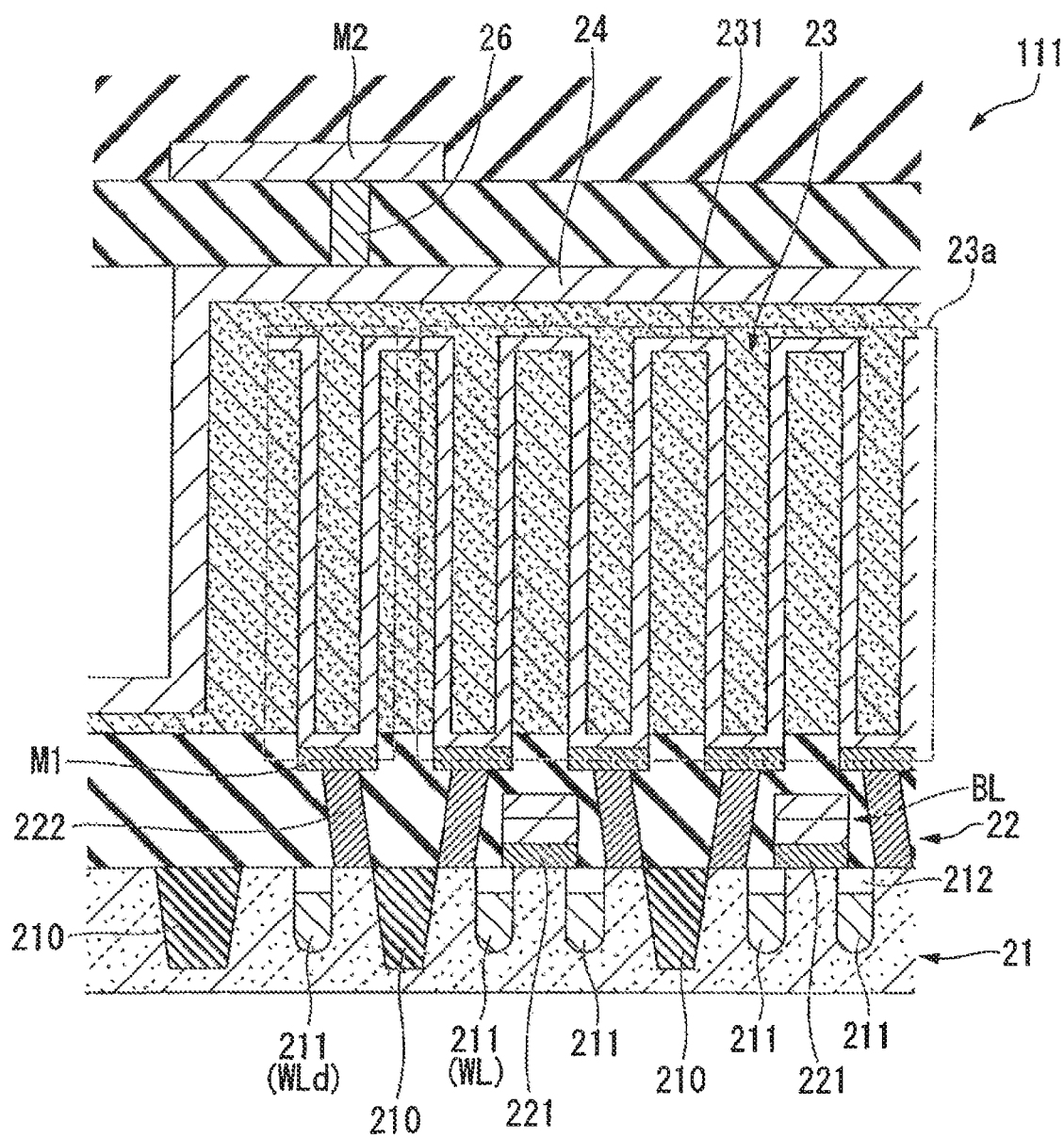
FIG. 4 is a cross-sectional view taken along the line A-A' in FIG. 3.

FIG. 3 is a diagram showing the memory cell portion 111 shown in FIG. 2B and an enlarged view showing in detail a part of the memory cell portion. FIG. 4 is a cross-sectional view taken along the line A-A' in FIG. 3. An internal configuration of the memory cell portion 111 will be described in detail with reference to FIGS. 3 and 4.

As seen from the cross-sectional view of FIG. 4, the memory cell portion 111 substantially includes at least a silicon substrate 21, an interlayer insulation film 22 provided on the silicon substrate 21, a plurality of capacitors 23, and a plate 24 covering the capacitors 23 in common.

There are arranged, on the silicon substrate 21, a plurality of element isolating insulation films 210 each formed, for example, of a silicon oxide film, active regions 25 formed by the silicon substrate 21 partitioned by the element isolating insulation films 210, and embedded gate electrodes 211 (i.e. word lines WL) formed for example by a layered structure of titanium nitride and tungsten and arranged between the element isolating insulation films 210. The embedded gate electrodes 211 provided at positions corresponding to dummy capacitors 23d to be described later constitute dummy word lines WLd supplied with VKK voltage.

A cap insulation film 212 formed, for example, of silicon nitride is provided on top of each of the embedded gate electrode 211. Although not shown in the figure, an impurity diffused region forming a source or drain is formed in the surface layer of the silicon substrate 21 between the embedded gate electrodes 211 (active regions 25) and in the surface layer of the silicon substrate 21 between the element isolating insulation film 210 and the embedded gate electrode 211 (active regions 25).

A bit contact 221 formed, for example, of doped polysilicon is provided on the active region between each pair of embedded gate electrodes 211, and a bit line BL formed of a layered structure of titanium nitride and tungsten is provided on each of the bit contacts 221.

In addition, a capacitance contact plug 222 formed, for example, of polysilicon, or titanium nitride and tungsten is provided on the active region between the element isolating insulation film 210 and the embedded gate electrodes 211 so as to pass through the interlayer insulation film 22. Each of the capacitance contact plugs 222 is connected to the corresponding capacitor 23 via a wiring M1.

The configuration described above constitutes two cell transistors which have a pair of embedded gate electrode 211 (word lines WL), capacitors 23, impurity diffused regions forming a source or drain region, and have a bit line BL in common.

As seen from the detailed plan view of FIG. 3, a capacitor 23 is provided at each of the positions where the word lines WL intersect with the bit lines BL when viewed in plan. Those capacitors 23 provided along the outer periphery of the memory cell portion 111 are dummy capacitors 23d, while the other capacitors are active capacitors 23a. The capacitors 23 are insulated with silicon nitride 231. The oval-shape regions shown FIG. 3 are active regions (impurity diffused regions) 25.

As shown in FIG. 4, the plate 24 is supplied with a ½ VARY voltage, for example, from the wiring M2 through a via 26. The VARY voltage is a voltage supplied to the memory array region.

Figure 5:
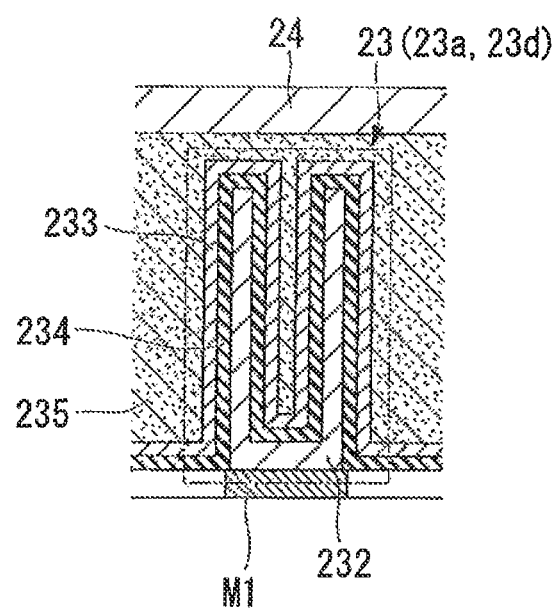
FIG. 5 is an enlarged view of an active capacitor and a dummy capacitor.

FIG. 5 is an enlarged view of the active capacitor and the dummy capacitor. As shown in FIG. 5, the capacitor 23 (the active capacitor 23a and the dummy capacitor 23d) has a crown shape, and is composed of a lower electrode 232, an upper electrode 233, and a dielectric film 234 interposed between the lower electrode 232 and the upper electrode 233. Polysilicon 235 and the plate 24 are formed on the upper electrode 233. The upper electrode 233 is supplied with ½ VARY voltage from the plate 24 as described above. The voltage of the lower electrode 232 in the active capacitor 23a depends on a data level transmitted from a bit line during write operation, and a memory capacitance is formed between the lower electrode 232 and the upper electrode 233 according to the level of this lower electrode 232. Accordingly, the active capacitors 23a provided in the memory cell portion 111 function as individual capacitors according to the potential level of the corresponding lower electrode 232.

Next, the compensation capacitance portion shown in FIG. 1 will be described.

Figure 6:
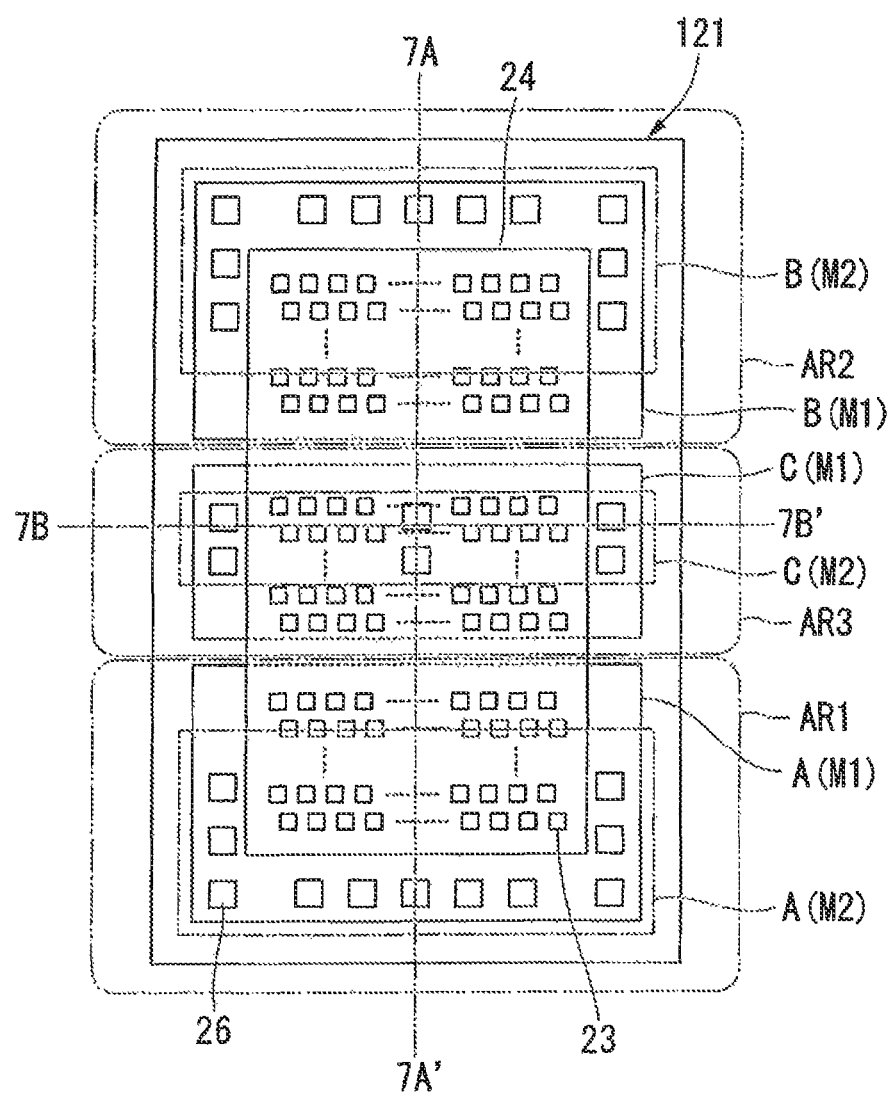
FIG. 6 is an enlarged view of a first compensation capacitance portion shown in FIG. 1.
Figure 7A:
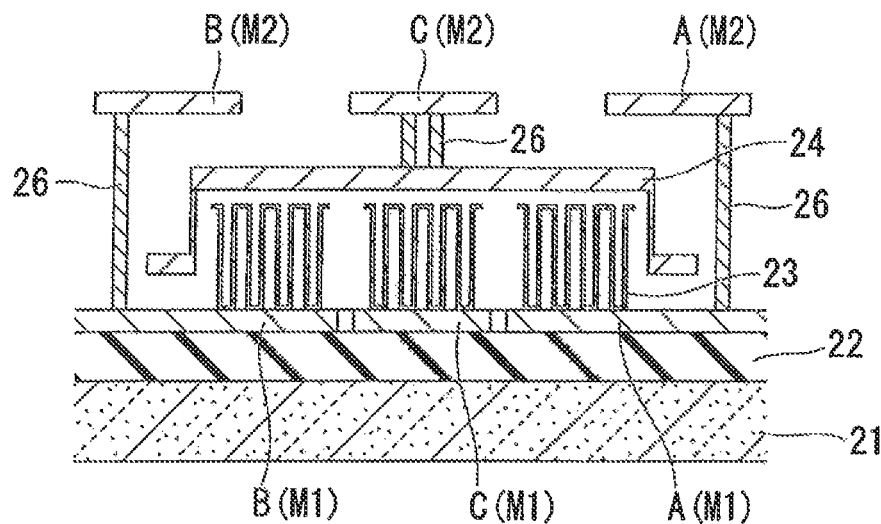
FIG. 7A is a cross-sectional view taken along the line 7A-7A' in FIG. 6.
Figure 7B:
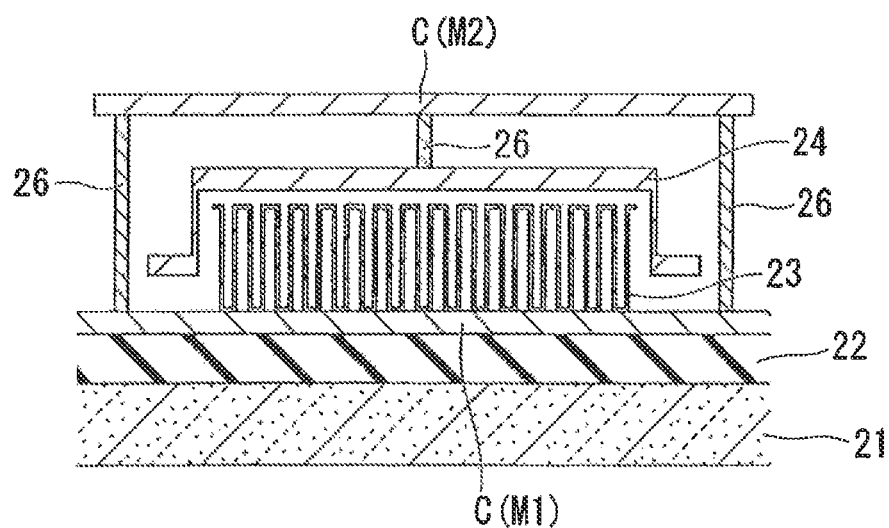
FIG. 7B is a cross-sectional view taken along the line 7B-7B' in FIG. 6.

FIG. 6 is an enlarged view of the first compensation capacitance portion 121 shown in FIG. 1. FIG. 7A is a cross-sectional view taken along the line 7A-7A' in FIG. 6, and FIG. 7B is a cross-sectional view taken along the line 7B-7B' in FIG. 6.

As shown in FIG. 6, the capacitors 23 of the first compensation capacitance portion 121 are arranged in an array, and are formed in the same process as the capacitors 23 of the memory cell portion 111. This means that the capacitors 23 of the first compensation capacitance portion 121 have substantially the same configuration as the one shown in FIG. 4, except that nothing is formed below the wirings M1.

As shown in FIG. 6, a first region AR1, a second region AR2, and a third region AR3 are virtually defined in the first compensation capacitance portion 121 for the sake of convenience of description.

The lower electrodes 232 of the capacitors 23 provided in the first region AR1 are connected in common to a terminal A (M1), and are supplied with a VPERI voltage, or a first voltage, from the terminal A (M1). The VPERI voltage is a voltage supplied to the peripheral region other than the memory array region. On the other hand, the lower electrodes 232 of the capacitors 23 provided in the second region AR2 are connected in common to a terminal B (M1), and are supplied with a VSS voltage, or a third voltage, from the terminal B (M1). A ground potential is usually selected as the VSS voltage. The lower electrodes 232 of the capacitors 23 provided in the third region AR3 are connected in common to a terminal C (M1), and are supplied with a ½ VPERI voltage, or a second voltage, from the terminal C (M1).

Figure 8:
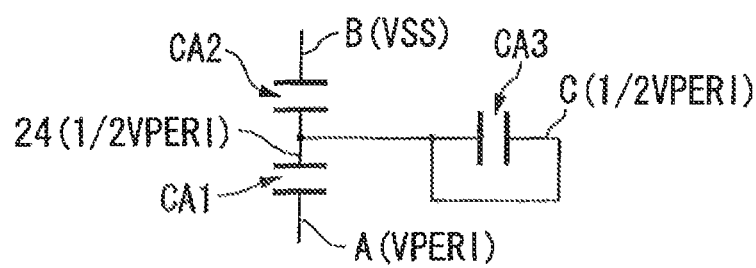
FIG. 8 is an equivalent circuit diagram of the first compensation capacitance portion.

The plate 24 is provided on the upper electrodes 233 in the first to third regions AR1 to AR3 to supply a ½ VPERI voltage in common to the upper electrodes 233 of the capacitors 23 in the first to third regions AR1 to AR3. Thus, a capacitance is formed between each of the lower electrodes 232 and each of the upper electrodes 233 in the first region AR1. Specifically, a capacitance CA1 is formed between the terminal A and the plate 24 (see FIG. 8 showing an equivalent circuit diagram of capacitances in the first compensation capacitance portion 121). The same applies to the second region AR2 as well (a capacitance CA2). In contrast, in the third region AR3 where the same voltage (½ VPERI) is supplied to the lower electrodes 232 and upper electrodes 233, no charge is stored in the capacitance. In other words, a capacitance CA3 provided in the third region AR3 is a dummy capacitance which does not function as compensation capacitance.

This embodiment features providing the capacitors 23 forming the dummy capacitances in the region used for the compensation capacitance, whereby it is made possible to increase the area of the region used for the compensation capacitance without exceeding a specified capacitance value and to prevent the capacitors from peeling off during the manufacturing process. Specifically, the area of the region used for the compensation capacitance is preferably set to at least 12.9 μm×12.9 μm or more. This compensation capacitance is used as compensation capacitance of an internal signal of the semiconductor device.

The compensation capacitance according to this embodiment is formed by serial connection between the capacitance CA1 formed in the first region AR1 and the capacitance CA2 formed in the second region AR2 (see FIG. 8). This is because if the voltage applied between the lower electrodes 232 and the upper electrodes 233 of the capacitors 23 is increased, the capacitors may be broken.

It should be noted that the voltages supplied to the terminals A to C are not limited to those described above. For example, the voltage applied to the terminal C (M1) may be floated. In this case, some of the vias 26 are not required any more, and the element size can be reduced by that much. Further, the region where the dummy capacitances are provided is not limited to the one described in this embodiment, and the dummy capacitances may be located, for example, on an edge of the region used for the compensation capacitance.

Figure 9A:
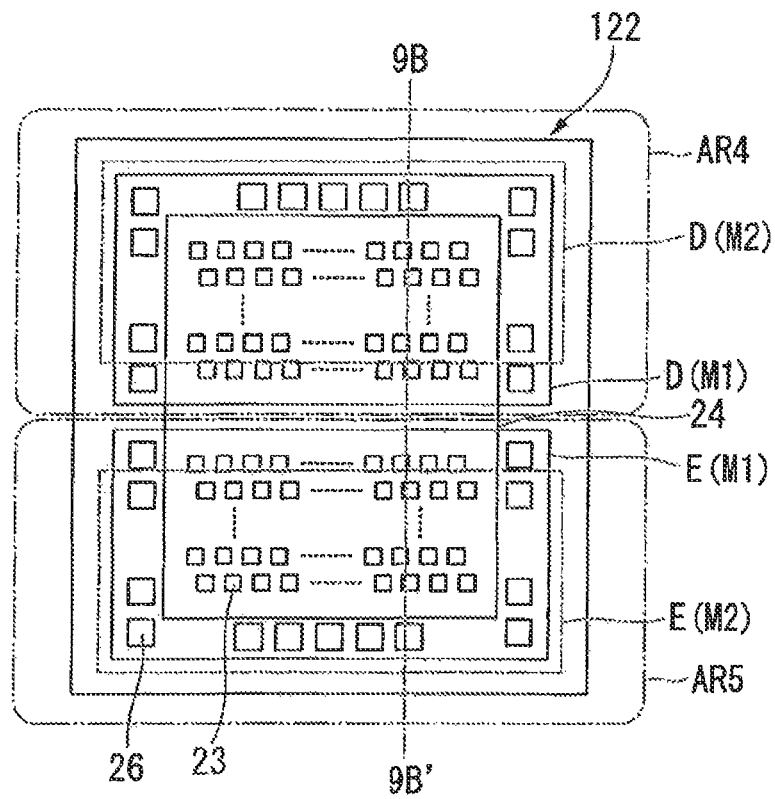
FIG. 9A is an enlarged view of a second compensation capacitance portion shown in FIG. 1.
Figure 9B:
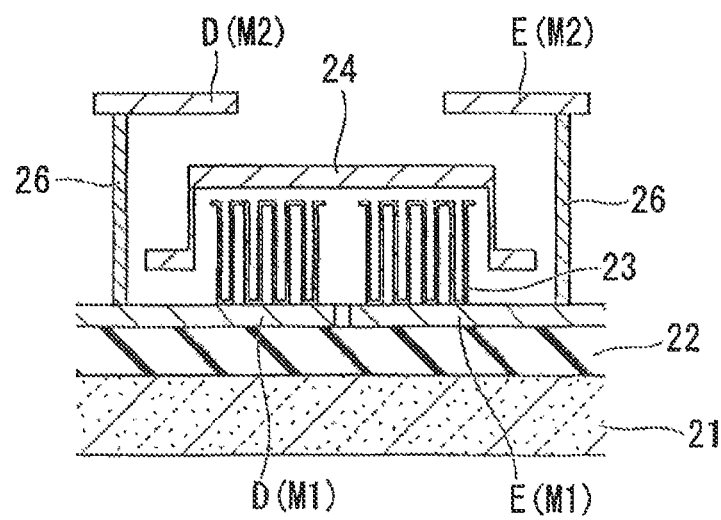
FIG. 9B is a cross-sectional view taken along the line 9B-9B' in FIG. 9A.

FIG. 9A is an enlarged view of the second compensation capacitance portion 122 shown in FIG. 1, and FIG. 9B is a cross-sectional view taken along the line 9B-9B' in FIG. 9A.

As shown in FIGS. 9A and 9B, the capacitors 23 of the second compensation capacitance portion 122 are arranged in an array, and are formed in the same process as the capacitors 23 of the memory cell portion 111. This means that the capacitors 23 of the second compensation capacitance portion 122 have substantially the same configuration as the one shown in FIG. 4, except that nothing is formed below the wirings M1.

The lower electrodes 232 of the capacitors 23 formed in a fourth region AR4 are connected in common to a terminal D (M1), and supplied with VPERI voltage from the terminal D (M1). The lower electrodes 232 of the capacitors 23 formed in a fifth region AR5 are connected in common to a terminal E (M1) and supplied with VSS voltage from the terminal E (M1).

Figure 10:
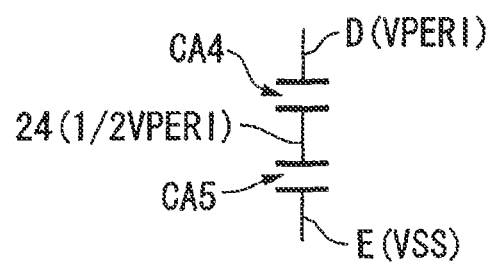
FIG. 10 is an equivalent circuit diagram of the second compensation capacitance portion.

The plate 24 is provided on the upper electrodes 233 in the fourth and fifth regions AR4 and AR5 to supply ½ VPERI voltage in common to the upper electrodes 233 of the capacitors 23 in the fourth and fifth regions AR4 and AR5. Thus, a capacitance is formed between each of the lower electrodes 232 and each of the upper electrodes 233 in the fourth region AR4. This means that a capacitance CA4 is formed between the terminal D and the plate 24 (see FIG. 10 showing an equivalent circuit diagram of capacitances in the second compensation capacitance portion 122). The same applies to the fifth region AR5 as well (capacitance CA5).

The capacitance value of the second compensation capacitance portion 122 is greater than the capacitance value of the first compensation capacitance portion 121. Therefore, formation of dummy capacitors is not required since a certain area is ensured without formation of the dummy capacitors.

Second Exemplary Embodiment

Figure 11A:
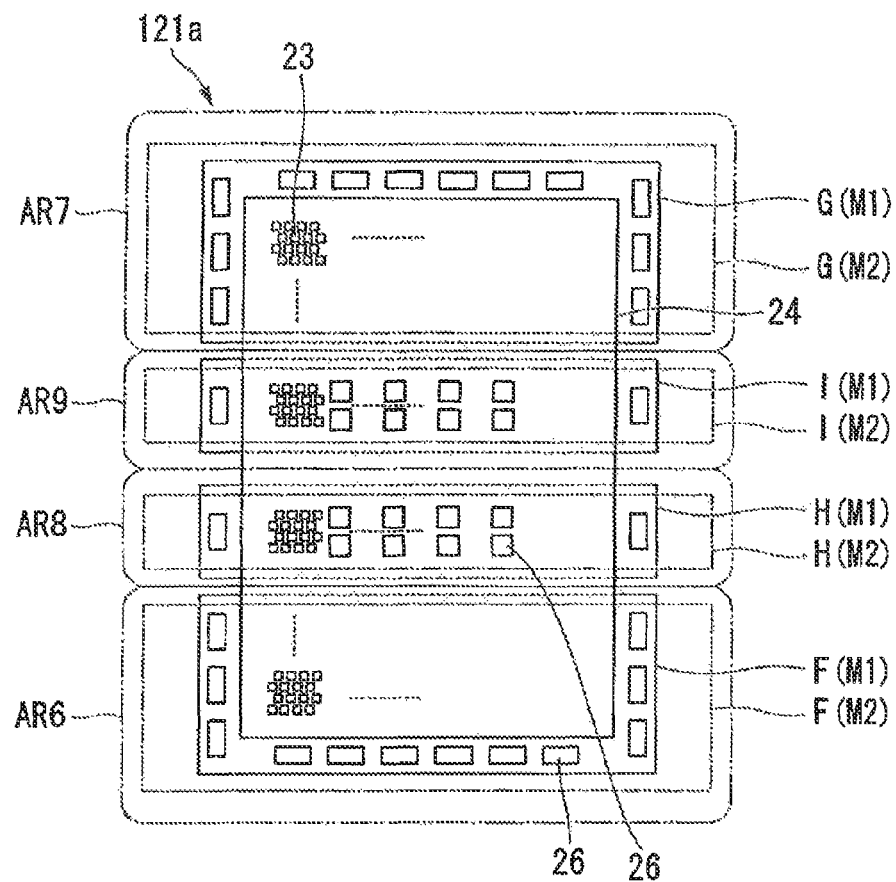
FIGS. 11A and 11B are diagrams for explaining a first compensation capacitance portion in a semiconductor device according to a second exemplary embodiment of the invention, FIG. 11A being a plan view of the first compensation capacitance portion, FIG. 11B being an equivalent circuit diagram thereof.
Figure 11B:
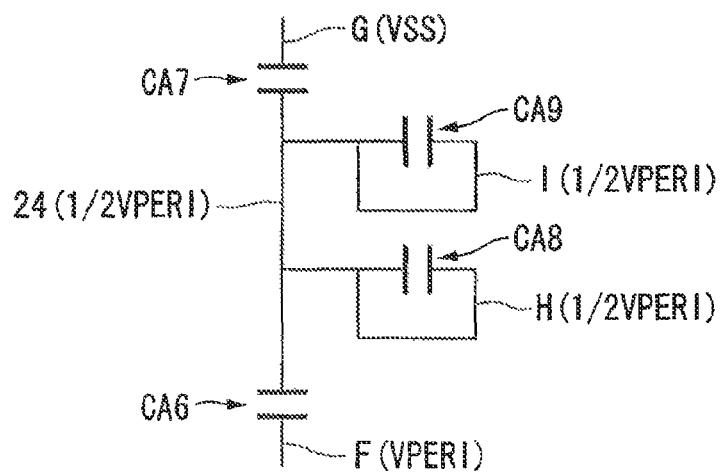

A second exemplary embodiment of the invention will be described. FIG. 11 is a diagram for explaining a first compensation capacitance portion 121a of a semiconductor device according to the second exemplary embodiment of the invention. FIG. 11A is a plan view of the first compensation capacitance portion 121a, and FIG. 11B is an equivalent circuit diagram thereof. The semiconductor device as a whole has the same configuration and functions as those of the first exemplary embodiment described with reference to FIGS. 1 to 5.

Capacitors 23 of the first compensation capacitance portion 121a are arranged in array and are formed in the same process as the capacitors 23 of the memory cell portion 111. This means that the capacitors 23 of the first compensation capacitance portion 121a have substantially the same configuration as that shown in FIG. 4, except that nothing is formed below the wirings M1.

As shown in FIG. 11A, sixth to ninth regions AR6 to AR9 are virtually defined in the first compensation capacitance portion 121a for the sake of convenience of description.

Lower electrodes 232 of the capacitors 23 provided in the sixth region AR6 are connected in common to a terminal F (M1) and supplied with VPERI voltage from the terminal F (M1). Lower electrodes 232 of the capacitors 23 provided in the seventh region AR7 are connected in common to a terminal G (M1), and supplied with VSS voltage from the terminal G (M1). Lower electrodes 232 of the capacitors 23 provided in the eighth region AR8 are connected in common to a terminal H (M1) and supplied with ½ VPERI voltage from the terminal H (M1). Lower electrodes 232 of the capacitors 23 provided in the ninth region AR9 are connected in common to a terminal I (M1) and supplied with a ½ VPERI voltage from the terminal I (M1).

A plate 24 is provided on upper electrodes 233 in the sixth to ninth regions AR6 to AR9 to supply ½ VPERI voltage in common to the upper electrodes 233 of the capacitors 23 in the sixth to ninth regions AR6 to AR9. Thus, a capacitance is formed between each of the lower electrodes 232 and each of the upper electrodes 233 in the sixth region AR6. This means that a capacitance CA6 is formed between the terminal F and the plate 24 (see FIG. 11B showing an equivalent circuit diagram of the capacitances of the first compensation capacitance portion 121a). The same applies to the seventh region AR7 (capacitance CA7).

In contrast, in the eighth region AR8 where the same voltage (½ VPERI) is supplied to the lower electrode 232 and the upper electrode 233, no charge is stored in the capacitance. This means that a capacitance CA8 provided in the eighth region AR8 is a dummy capacitance which does not function as compensation capacitance. Likewise, a capacitance CA9 provided in the ninth region AR9 is a dummy capacitance which does not function as compensation capacitance.

As described above, the second exemplary embodiment also features providing the capacitors 23 constituting a dummy capacitance in the region used for the compensation capacitance, which makes it possible to increase the area used for the compensation capacitance without exceeding a specified capacitance value and to prevent the capacitors from peeling off during the manufacturing process.

Like in the first exemplary embodiment, voltages supplied to the terminals F to I are not limited to those described above. For example, the voltage supplied to the terminals H (M1) and I (M1) may be floated. The region where the dummy capacitance is provided may be located, for example, on an edge of the region used for the compensation capacitance.

Figure 12A:
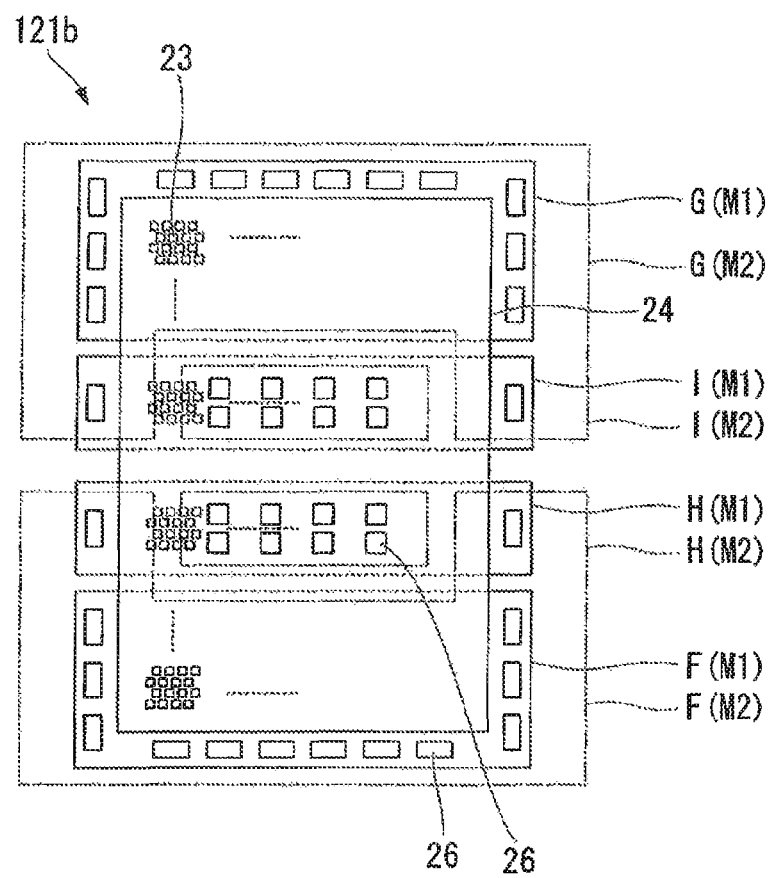
FIGS. 12A and 12B are diagrams for explaining a case in which a dummy capacitance is converted into a so-called real capacitance in the compensation capacitance portion according to the second exemplary embodiment shown in FIG. 11.
Figure 12B:
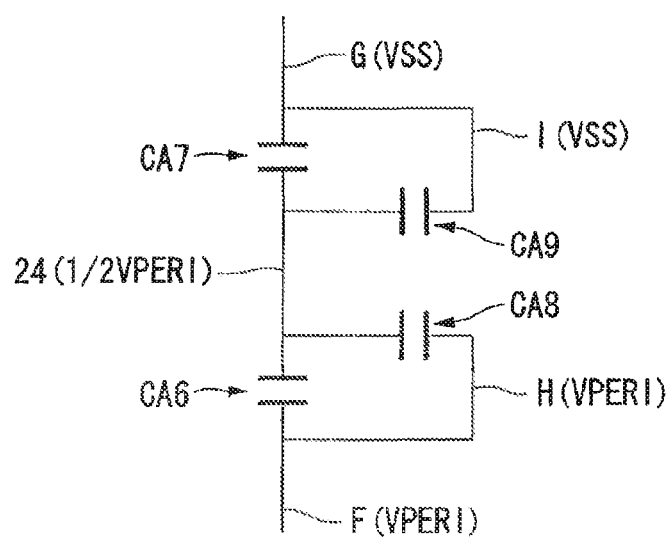

Next, description will be made of a case in which the dummy capacitance in the compensation capacitance portion 121a according to the second exemplary embodiment shown in FIG. 11 is converted into a so-called real capacitance. FIGS. 12A and 12B are a diagram for explaining this case, and FIG. 12A is a plan view while FIG. 12B is an equivalent circuit diagram thereof.

As shown in FIG. 12A, VPERI voltage is supplied to some or all of the wirings M2 serving as the dummy capacitance terminals H in the eighth region AR8, and VSS voltage is supplied to some or all of the wirings M2 serving as the dummy capacitance terminals I in the ninth region AR9, whereby the part used as the dummy capacitance in the configuration shown in FIG. 11 is enabled to be used as the so-called real capacitance. The equivalent circuit is shown in FIG. 12B. This configuration makes it possible to adjust the capacitance.

Although the above description of the semiconductor device according to the exemplary embodiments has been made in terms of the configuration of a DRAM, the invention is not limited to a DRAM. The invention can be applied to semiconductor memories other than DRAMs (such as SRAMs, PRAMs, and flash memories) or controllers other than memories.

The semiconductor device according to the invention is applicable to semiconductor memories such as DRAMs, SRAMs, PRAMs, and flash memories, and controllers.

While the invention has been particularly shown and described in terms of preferred embodiments thereof, it should be understood that the invention is not limited to these embodiments but may be variously embodied without departing from the spirit and scope of the invention.

What is claimed is:

1. A semiconductor device comprising a power supply, a first capacitor and a second capacitor, each of the first and second capacitors including first and second electrodes, the first electrode of the first capacitor and the first electrode of the second capacitor being connected in common and being supplied with a first voltage from the power supply, the second electrode of the first capacitor being supplied with a second voltage from the power supply, the second voltage being different from the first voltage, and the second electrode of the second capacitor being supplied with the first voltage.

2. The semiconductor device according to claim 1, further comprising a third capacitor including a first electrode connected in common to the first electrodes of the first and second capacitors and applied with the first voltage, and a second electrode applied with a third voltage that is different from the first and second voltages.

3. The semiconductor device according to claim 1, wherein the semiconductor device includes a memory array region having a plurality of memory cells and a peripheral region free from memory cells, and the first and second capacitors are provided in the peripheral region.

4. The semiconductor device according to claim 1, wherein the first voltage is about a half of the second voltage.

5. The semiconductor device according to claim 2, wherein the first voltage is about a half of the second voltage, and the third voltage is a ground voltage.

6. The semiconductor device according to claim 2, further comprising a fourth capacitor including a first electrode connected in common to the first electrodes of the first, second and third capacitors and applied with the first voltage, and a second electrode applied with the first voltage.

7. A semiconductor device comprising:
a power supply;
a memory cell array region including a plurality of memory cells each of which includes a memory cell capacitor; and
a peripheral region including first and second compensation capacitors, each of the first and second compensation capacitors being the same in structure as the memory cell capacitor; wherein,
the first compensation capacitor includes first and second electrodes, the second compensation capacitor including third and fourth electrodes, the first electrode of the first compensation capacitor and the third and fourth electrodes of the second compensation capacitor are commonly supplied with a first voltage from the power supply, and the second electrode of the first compensation capacitor being supplied with a second voltage, which is different from the first voltage from the power supply.

8. The semiconductor device according to claim 7, further comprising:
a first line connected to the first electrode of the first compensation capacitor and the third and fourth electrodes of the second compensation capacitor in common to supply the first voltage to the first, third and fourth electrodes; and
a second line connected to the second electrode of the first compensation capacitor to supply the second voltage to the second electrode.

9. The semiconductor device according to claim 7, wherein the peripheral region further includes a third compensation capacitor which is the same in structure as the memory cell capacitor, and the third compensation capacitor including a fifth electrode supplied with the first voltage and a sixth electrode supplied with a third voltage which is different from the first and second voltages.

10. The semiconductor device according to claim 9, further comprising:
a first line connected to the first electrode of the first compensation capacitor, the third and fourth electrodes of the second compensation capacitor and the fifth electrode of the third compensation capacitor in common to supply the first voltage to the first, third, fourth and fifth electrodes;
a second line connected to the second electrode of the first compensation capacitor to supply the second voltage to the second electrode; and
a third line connected to the sixth electrode of the third compensation capacitor to supply the third voltage to the sixth electrode.

* * * * *